United States Patent
Kondo et al.

(10) Patent No.: US 11,307,279 B2
(45) Date of Patent: Apr. 19, 2022

(54) MAGNETIC RESONANCE IMAGING METHOD AND APPARATUS

(71) Applicant: CANON MEDICAL SYSTEMS CORPORATION, Otawara (JP)

(72) Inventors: Hiroki Kondo, Nasushiobara (JP); Masanori Ozaki, Hachioji (JP); Masaaki Umeda, Sakura (JP)

(73) Assignee: CANON MEDICAL SYSTEMS CORPORATION, Otawara (JP)

( * ) Notice: Subject to any disclaimer, the term of this patent is extended or adjusted under 35 U.S.C. 154(b) by 0 days.

(21) Appl. No.: 17/179,853

(22) Filed: Feb. 19, 2021

(65) Prior Publication Data

US 2021/0278493 A1    Sep. 9, 2021

(30) Foreign Application Priority Data

Mar. 9, 2020    (JP) .............................. JP2020-040219

(51) Int. Cl.
  *G01R 33/561*    (2006.01)
  *G01R 33/48*    (2006.01)

(52) U.S. Cl.
  CPC ..... *G01R 33/5617* (2013.01); *G01R 33/4818* (2013.01)

(58) Field of Classification Search
  CPC .................. G01R 33/4818; G01R 33/5617
  See application file for complete search history.

(56) References Cited

U.S. PATENT DOCUMENTS

| | | | |
|---|---|---|---|
| 6,420,870 B1 * | 7/2002 | Kiefer ................ | G01R 33/5615 |
| | | | 324/307 |
| RE45,725 E * | 10/2015 | Mugler, III ........ | G01R 33/5602 |
| 10,191,133 B2 | 1/2019 | Beck et al. | |
| 2015/0241537 A1 | 8/2015 | Dannels | |
| 2015/0369891 A1 | 12/2015 | Miyazaki et al. | |
| 2018/0140218 A1 * | 5/2018 | Heberlein .............. | G01R 33/50 |

FOREIGN PATENT DOCUMENTS

| | | |
|---|---|---|
| JP | 8-56920 A | 3/1996 |
| JP | 9-508 A | 1/1997 |
| JP | 2015-160141 A | 9/2015 |
| JP | 2016-7539 A | 1/2016 |

* cited by examiner

*Primary Examiner* — Gregory H Curran
(74) *Attorney, Agent, or Firm* — Oblon, McClelland, Maier & Neustadt, L.L.P.

(57) ABSTRACT

A magnetic resonance imaging method according to an embodiment is a method for implementing a multi-shot Fast Spin Echo method. The method includes acquiring, for a k-space divided into a plurality of segments with respect to a phase encode direction, one of the segments including a central region of the k-space with one shot, wherein, during the one-shot acquisition for the central region of the k-space, refocus pulses corresponding to a first time period among refocus pulses applied a plurality of times have a flip angle decreasing tendency, and refocus pulses corresponding to a second time period following the first time period among the refocus pulses applied the plurality of times have a flip angle maintaining or increasing tendency.

16 Claims, 10 Drawing Sheets

FIG.7
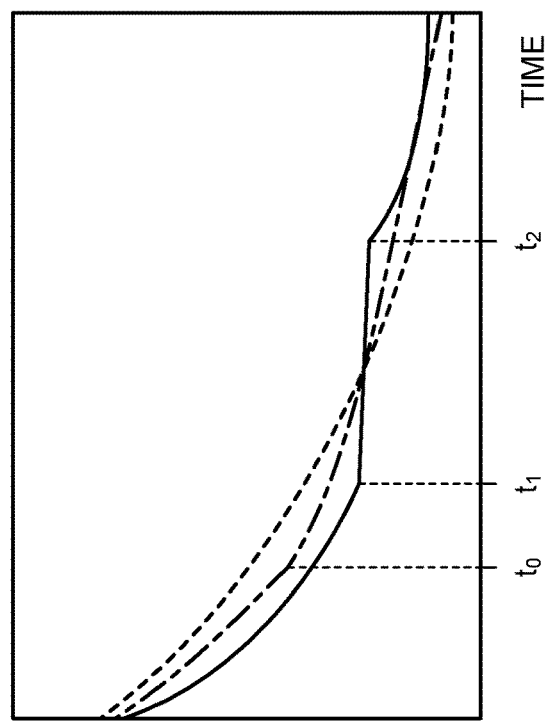
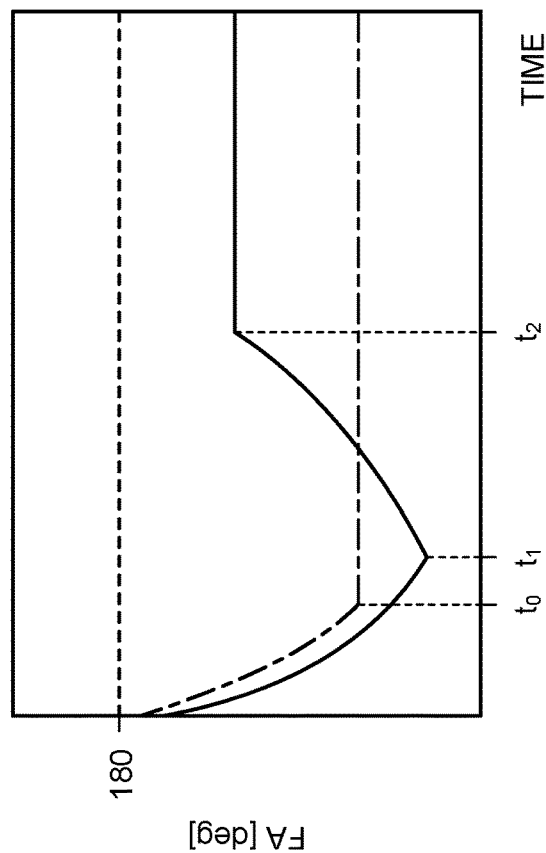

FIG.8
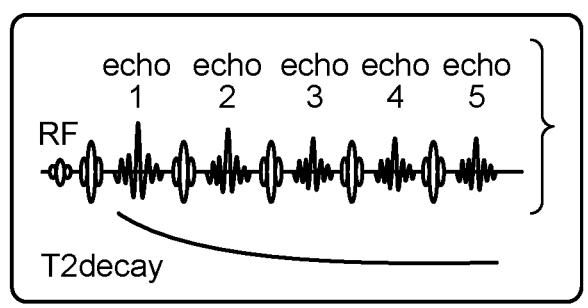
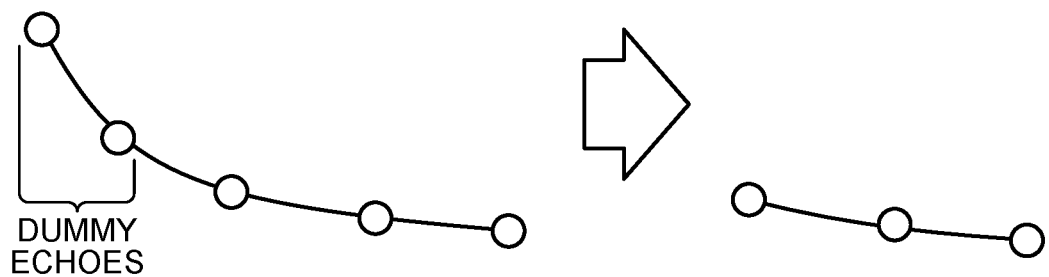

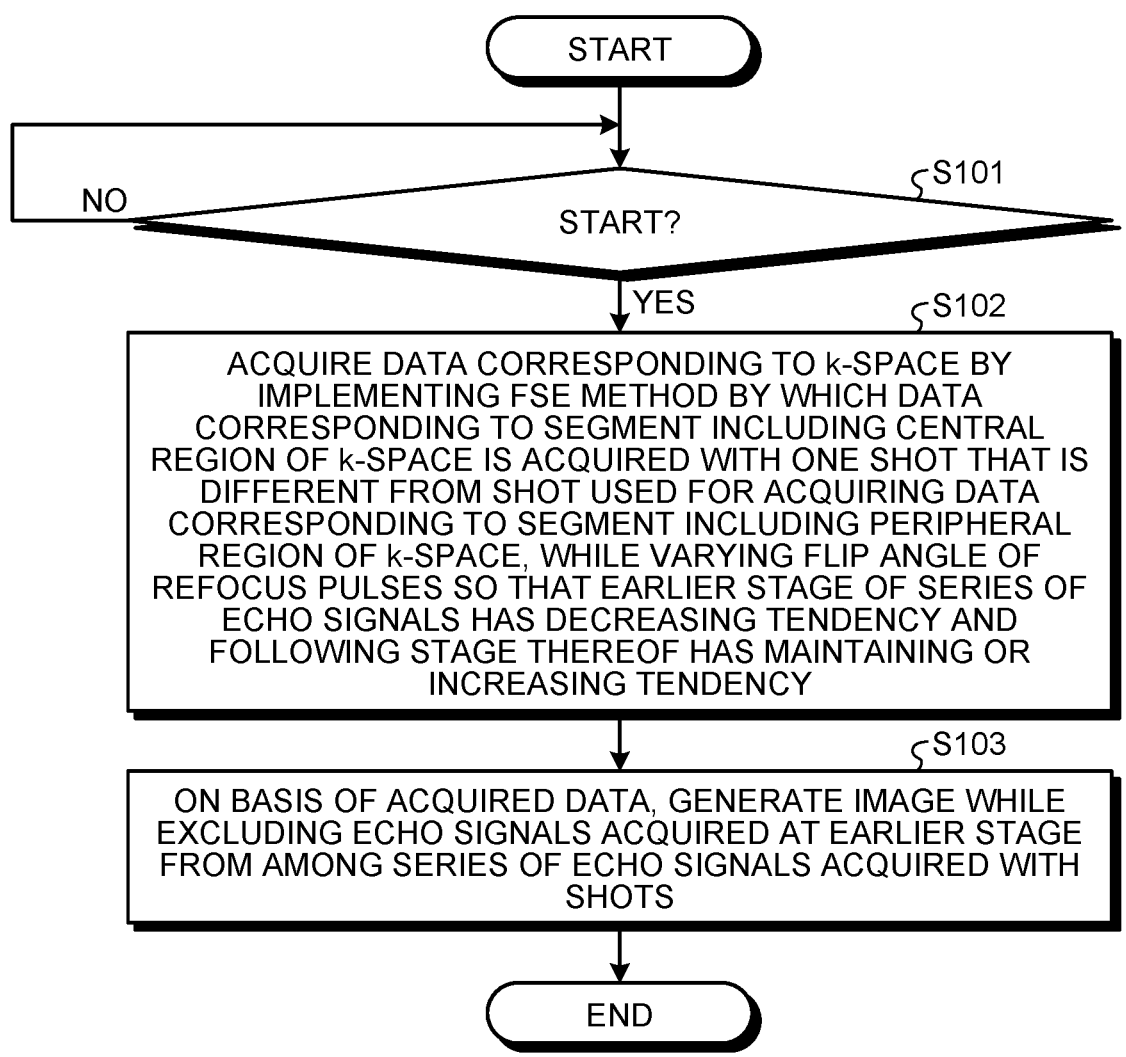

MAGNETIC RESONANCE IMAGING METHOD AND APPARATUS

CROSS-REFERENCE TO RELATED APPLICATIONS

This application is based upon and claims the benefit of priority from Japanese Patent Application No. 2020-040219, filed on Mar. 9, 2020; the entire contents of which are incorporated herein by reference.

FIELD

Embodiments described herein relate generally to a method and an apparatus for magnetic resonance imaging.

BACKGROUND

A Fast Spin Echo (FSE) method is conventionally known as an imaging method related to Magnetic Resonance Imaging (MRI) apparatuses. The FSE method is an imaging method by which a plurality of echo signals are acquired by applying a plurality of refocus pulses after applying an excitation pulse once. According to the FSE method, data corresponding to a k-space may be acquired by using a multi-shot scheme by which one-shot acquisition is repeatedly performed. According to a multi-shot FSE method, it is known, for example, that an artifact may be caused in an image when a subject moves during the acquisition of a certain shot.

BRIEF DESCRIPTION OF THE DRAWINGS

FIG. 7 is a drawing for explaining changes in a flip angle of refocus pulses in the data acquisition method according to the present embodiment;
FIG. 8 is a drawing for explaining an image generating process performed by a generating function according to the present embodiment;
FIG. 10 is a flowchart illustrating a processing procedure in the data acquisition method implemented by the MRI apparatus according to the present embodiment.

DETAILED DESCRIPTION

A magnetic resonance imaging method according to an embodiment is a method for implementing a multi-shot Fast Spin Echo (FSE) method by which a k-space is filled with data by executing multiple sessions of one-shot acquisition during each of which a refocus pulse is applied a plurality of times after an excitation pulse is applied once, so as to acquire a plurality of echo signals. The magnetic resonance imaging method includes acquiring, for the k-space divided into a plurality of segments with respect to a phase encode direction, one of the segments including a central region of the k-space with one shot, wherein, during the one-shot acquisition for the central region of the k-space, refocus pulses corresponding to a first time period among the refocus pulses applied the plurality of times have a flip angle decreasing tendency, and refocus pulses corresponding to a second time period following the first time period among the refocus pulses applied the plurality of times have a flip angle maintaining or increasing tendency.

Exemplary embodiments of a method and an apparatus for magnetic resonance imaging of the present disclosure will be explained in detail below, with reference to the accompanying drawings.

Embodiments

Figure 1:
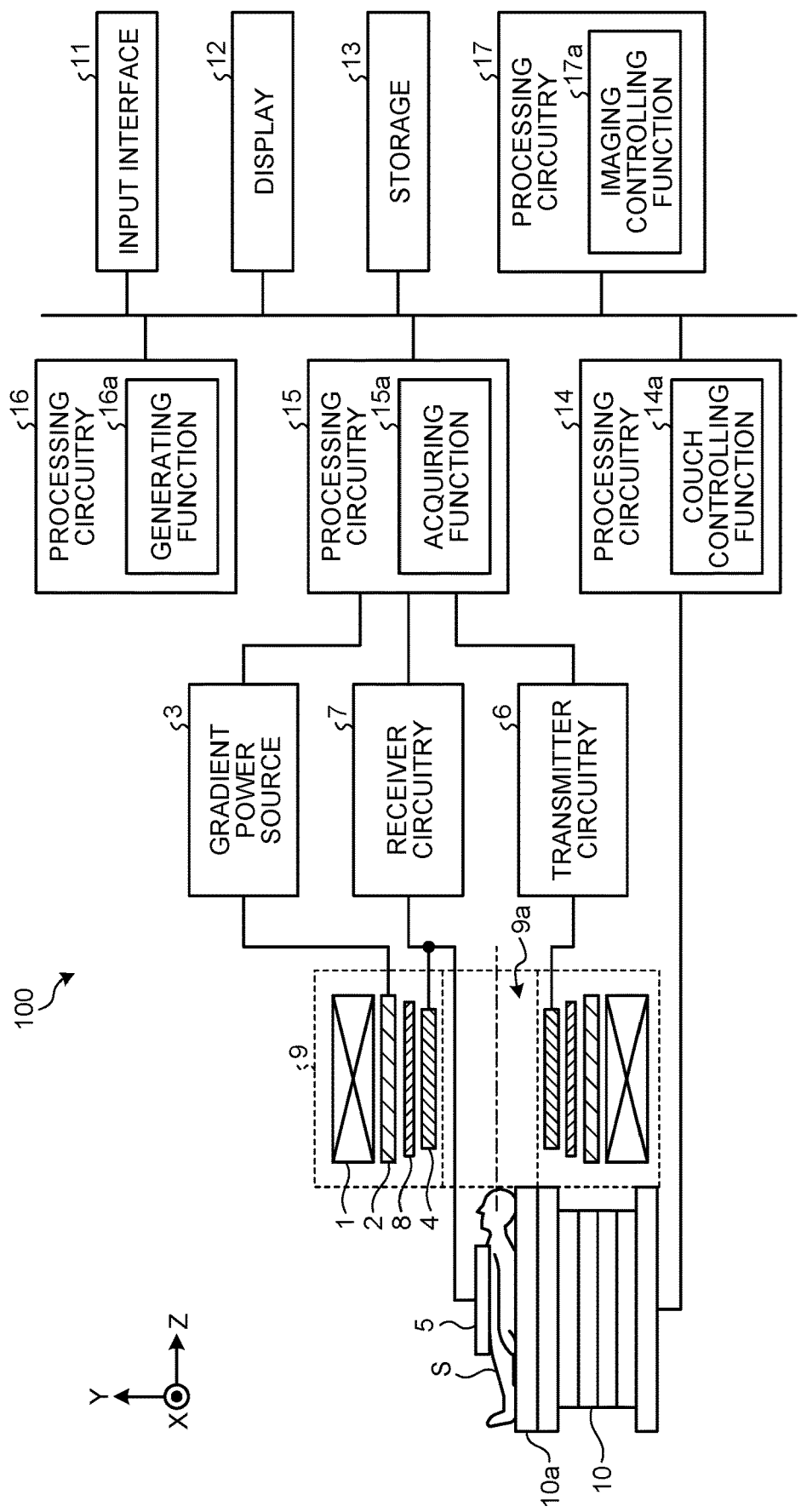
FIG. 1 is a diagram illustrating an exemplary configuration of an MRI apparatus according to an embodiment of the present disclosure.

FIG. 1 is a diagram illustrating an exemplary configuration of an MRI apparatus according to an embodiment of the present disclosure.

For example, as illustrated in FIG. 1, an MRI apparatus 100 includes a static magnetic field magnet 1, a gradient coil 2, a gradient power source 3, a whole body Radio Frequency (RF) coil 4, a local RF coil 5, transmitter circuitry 6, receiver circuitry 7, a Radio Frequency (RF) shield 8, a gantry 9, a couch 10, an input interface 11, a display 12, a storage 13, and processing circuitry 14 to 16.

The static magnetic field magnet 1 is configured to generate a static magnetic field in an imaging space in which a subject S is placed. More specifically, the static magnetic field magnet 1 is formed to have a hollow and substantially circular cylindrical shape (which may have an oval cross-section orthogonal to the central axis thereof) and is configured to generate the static magnetic field in the imaging space formed on the inner circumferential side thereof. For example, the static magnetic field magnet 1 may be a superconductive magnet, a permanent magnet, or the like. In the present example, the superconductive magnet may be structured by using, for instance, a container filled with a cooling member such as liquid helium and a semiconductor coil immersed in the container.

The gradient coil 2 is arranged on the inside of the static magnetic field magnet 1 and is configured to generate gradient magnetic fields in the imaging space in which the subject S is placed. More specifically, the gradient coil 2 is formed to have a hollow and substantially circular cylindrical shape (which may have an oval cross-section orthogonal to the central axis thereof) and includes an X coil, a Y coil, and a Z coil corresponding to an X-axis, a Y-axis, and a Z-axis, respectively, that are orthogonal to one another. The X coil, the Y coil, and the Z coil are configured to generate, in the imaging space, the gradient magnetic fields that linearly change along the respective axial directions, on the basis of electric currents supplied thereto from the gradient power source 3. In this situation, the Z-axis is set along a magnetic flux in the static magnetic field generated by the static magnetic field magnet 1. Further, the X-axis is set along a horizontal direction orthogonal to the Z-axis. The Y-axis is set along a vertical direction orthogonal to the Z-axis. Accordingly, the X-axis, the Y-axis, and the Z-axis structure an apparatus coordinate system unique to the MRI apparatus 100.

By supplying the electric currents to the gradient coil 2, the gradient power source 3 is configured to cause the gradient magnetic fields to be generated within the imaging space. More specifically, by individually supplying the electric current to each of the X, Y, and Z coils in the gradient coil 2, the gradient power source 3 is configured to cause the gradient magnetic fields to be generated in the imaging space, so as to linearly changing along a readout direction, a phase encode direction, and a slice direction, respectively, that are orthogonal to one another. In the following sections, the gradient magnetic field along the readout direction will be referred to as a readout gradient magnetic field. The gradient magnetic field along the phase encode direction will be referred to as a phase encode gradient magnetic field. The gradient magnetic field along the slice direction will be referred to as a slice gradient magnetic field.

In this situation, as each being superimposed on the static magnetic field generated by the static magnetic field magnet 1, the readout gradient magnetic field, the phase encode gradient magnetic field, and the slice gradient magnetic field append spatial position information to a magnetic resonance signal (e.g., an echo signal) emitted from the subject S. More specifically, the readout gradient magnetic field appends position information along the readout direction to the magnetic resonance signal, by changing the frequency of the magnetic resonance signal in accordance with the position in the readout direction. Further, the phase encode gradient magnetic field appends position information along the phase encode direction to the magnetic resonance signal, by changing the phase of the magnetic resonance signal along the phase encode direction. In addition, the slice gradient magnetic field appends position information along the slice direction to the magnetic resonance signal. For example, the slice gradient magnetic field is used for determining the orientations, the thicknesses, and the quantity of slice regions when imaged regions are the slice regions (2D imaging) and is used for changing the phase of the magnetic resonance signal in accordance with the position in the slice direction when an imaged region is a volume region (3D imaging). Accordingly, the axis along the readout direction, the axis along the phase encode direction, and the axis along the slice direction structure a logical coordinate system used for defining the slice regions or the volume region subject to the imaging process.

The whole body RF coil 4 is arranged on the inner circumferential side of the gradient coil 2 and is configured to apply an RF magnetic field to the subject S placed in the imaging space and to receive the magnetic resonance signal emitted from the subject S due to influence of the RF magnetic field. More specifically, the whole body RF coil 4 is formed to have a hollow and substantially circular cylindrical shape (which may have an oval cross-section orthogonal to the central axis thereof) and is configured to apply the RF magnetic field to the subject S placed in the imaging space positioned on the inner circumferential side thereof, on the basis of an RF pulse signal supplied thereto from the transmitter circuitry 6. Further, the whole body RF coil 4 is configured to receive the magnetic resonance signal emitted from the subject S due to the influence of the RF magnetic field and to output the received magnetic resonance signal to the receiver circuitry 7.

The local RF coil 5 is configured to receive the magnetic resonance signal emitted from the subject S. More specifically, the local RF coil 5 is prepared for each site of the subject S and, when an imaging process is to be performed on the subject S, is arranged in the vicinity of the surface of the site to be imaged. Further, the local RF coil 5 is configured to receive the magnetic resonance signal emitted from the subject S due to the influence of the RF magnetic field applied by the whole body RF coil 4 and to output the received magnetic resonance signal to the receiver circuitry 7. In addition, the local RF coil 5 may further have the function of applying the RF magnetic field to the subject S. In that situation, the local RF coil 5 is connected to the transmitter circuitry 6 and is configured to apply the RF magnetic field to the subject S on the basis of the RF pulse signal supplied thereto from the transmitter circuitry 6. For example, the local RF coil 5 may be a surface coil or a phased array coil structured by combining together a plurality of surface coils as coil elements.

The transmitter circuitry 6 is configured to output the RF pulse signal corresponding to a Larmor frequency unique to targeted atomic nuclei placed in the static magnetic field, to the whole body RF coil 4. More specifically, the transmitter circuitry 6 includes a pulse generator, an RF generator, a modulator, and an amplifier. The pulse generator is configured to generate a waveform of the RF pulse signal. The RF generator is configured to generate an RF signal having a resonance frequency. The modulator is configured to generate the RF pulse signal by modulating the amplitude of the RF signal generated by the RF generator, with the waveform generated by the pulse generator. The amplifier is configured to amplify the RF pulse signal generated by the modulator and to output the amplified signal to the whole body RF coil 4.

The receiver circuitry 7 is configured to generate magnetic resonance data on the basis of the magnetic resonance signal output from either the whole body RF coil 4 or the local RF coil 5 and to output the generated magnetic resonance data to the processing circuitry 15. For example, the receiver circuitry 7 includes a selector, a pre-amplifier, a phase detector, and an analog/digital (A/D) converter. The selector is configured to selectively receive an input of the magnetic resonance signal output from either the whole body RF coil 4 or the local RF coil 5. The pre-amplifier is configured to amplify the magnetic resonance signal output from the selector. The phase detector is configured to detect the phase of the magnetic resonance signal output from the pre-amplifier. The A/D converter is configured to generate the magnetic resonance data by converting an analog signal output from the phase detector into a digital signal and to output the generated magnetic resonance data to the processing circuitry 15. In this situation, the processes described as being performed by the receiver circuitry 7 do not all necessarily have to be performed by the receiver circuitry 7. One or more of the processes (e.g., the process by the A/D converter) may be performed by either the whole body RF coil 4 or the local RF coil 5.

The RF shield 8 is arranged between the gradient coil 2 and the whole body RF coil 4 and is configured to shield the gradient coil 2 from the RF magnetic field generated by the whole body RF coil 4. More specifically, the RF shield 8 is formed to have a hollow and substantially circular cylindrical shape (which may have an oval cross-section orthogonal to the central axis thereof) and is arranged in the space on the inner circumferential side of the gradient coil 2 so as to cover the outer circumferential surface of the whole body RF coil 4.

The gantry 9 has a hollow bore 9a formed to have a substantially circular cylindrical shape (which may have an oval cross-section orthogonal to the central axis thereof) and houses therein the static magnetic field magnet 1, the gradient coil 2, the whole body RF coil 4, and the RF shield 8. More specifically, the gantry 9 houses these elements therein, while the whole body RF coil 4 is arranged on the outer circumferential side of the bore 9a; the RF shield 8 is arranged on the outer circumferential side of the whole body RF coil 4; the gradient coil 2 is arranged on the outer circumferential side of the RF shield 8; and the static magnetic field magnet 1 is arranged on the outer circumferential side of the gradient coil 2. In this situation, the space inside the bore 9a of the gantry 9 serves the imaging space in which the subject S is placed at the time of the imaging process.

The couch 10 includes a couchtop 10a on which the subject S is placed. When the imaging process is performed on the subject S, the couchtop 10a on which the subject S is placed is moved into the imaging space. For example, the couch 10 is installed so that the longitudinal direction of the couchtop 10a extends parallel to the central axis of the static magnetic field magnet 1.

The example has been explained in which the MRI apparatus 100 has a so-called tunnel-like structure in which the static magnetic field magnet 1, the gradient coil 2, and the whole body RF coil 4 are each formed to have the substantially cylindrical shape; however, possible embodiments are not limited to this example. For instance, the MRI apparatus 100 may have a so-called open structure in which a pair of static magnetic field magnets, a pair of gradient coils, and a pair of RF coils are arranged so as to oppose each other, while the imaging space in which the subject S is placed is interposed therebetween. In the open structure, the space interposed between the pair of static magnetic field magnets, the pair of gradient coils, and the pair of RF coils corresponds to the bore in the tunnel-like structure.

The input interface 11 is configured to receive operations to input various types of instructions and various types of information from an operator. More specifically, the input interface 11 is connected to the processing circuitry 17 and is configured to convert the input operations received from the operator into electrical signals and to output the electrical signals to the processing circuitry 17. For example, the input interface 11 is realized by using a trackball, a switch button, a mouse, a keyboard, a touchpad on which an input operation can be performed by touching the operation surface thereof, a touch screen in which a display screen and a touchpad are integrally formed, a contactless input circuit using an optical sensor, an audio input circuit, and/or the like that are used for setting imaging conditions, a Region of Interest (ROI), and the like. In the present disclosure, the input interface 11 does not necessarily have to include one or more physical operational component parts such as a mouse, a keyboard, and/or the like. Examples of the input interface 11 include, for instance, electrical signal processing circuitry configured to receive an electrical signal corresponding to an input operation from an external input device provided separately from the apparatus and to output the electrical signal to a control circuit.

The display 12 is configured to display various types of information and various types of images. More specifically, the display 12 is connected to the processing circuitry 17 and is configured to convert various types of information and data of various types of images sent thereto from the processing circuitry 17 into display-purpose electrical signals and to output the electrical signals. For example, the display 12 is realized by using a liquid crystal monitor, a Cathode Ray Tube (CRT) monitor, a touch panel, or the like.

The storage 13 is configured to store various types of data therein. More specifically, the storage 13 is configured to store therein the magnetic resonance data and image data. For example, the storage 13 is realized by using a semiconductor memory element such as a Random Access memory (RAM) or a flash memory, or a hard disk, an optical disk, or the like.

The processing circuitry 14 includes a couch controlling function 14a. The couch controlling function 14a is configured to control operations of the couch 10 by outputting control-purpose electrical signals to the couch 10. For example, via the input interface 11, the couch controlling function 14a is configured to receive, from the operator, an instruction to move the couchtop 10a in a longitudinal direction, an up-and-down direction, or a left-and-right direction and to bring a moving mechanism of the couchtop 10a included in the couch 10 into operation, so as to move the couchtop 10a according to the received instruction.

The processing circuitry 15 includes an acquiring function 15a. The acquiring function 15a is configured to acquire the magnetic resonance data of the subject S by executing any of various types of pulse sequences. More specifically, the acquiring function 15a is configured to execute the various types of pulse sequences by driving the gradient power source 3, the transmitter circuitry 6, and the receiver circuitry 7 according to sequence execution data output from the processing circuitry 17. In this situation, the sequence execution data is data representing the pulse sequences and is information that defines: the timing with which the electric current is to be supplied by the gradient power source 3 to the gradient coil 2 and the intensity of the electric current to be supplied; the timing with which the radio frequency pulse signal is to be supplied by the transmitter circuitry 6 to the whole body RF coil 4 and the intensity of the radio frequency pulse to be supplied; the timing with which the magnetic resonance signal is sampled by the receiver circuitry 7; and the like. Further, as a result of a pulse sequence being executed, the acquiring function 15a is configured to receive the magnetic resonance signal data output from the receiver circuitry 7 and to store the data into the storage 13. In this situation, the magnetic resonance data stored in the storage 13 is stored as data (k-space data) corresponding to a two- or three-dimensional k-space, as a result of having appended thereto the position information along the directions of the readout direction, the phase encode direction, and the slice direction, by the readout gradient magnetic field, the phase encode gradient magnetic field, and the slice gradient magnetic field described above.

The processing circuitry 16 includes a generating function 16a. The generating function 16a is configured to generate various types of images on the basis of the magnetic resonance data acquired by the acquiring function 15a. More specifically, the generating function 16a is configured to generate a two- or three-dimensional image by reading the magnetic resonance data acquired by the acquiring function 15a from the storage 13 and performing a reconstructing process such as a Fourier transform on the read magnetic resonance data. After that, the generating function 16a is configured to store the generated image into the storage 13.

The processing circuitry 17 includes an imaging controlling function 17a. The imaging controlling function 17a is configured to control the entirety of the MRI apparatus 100 by controlling constituent elements of the MRI apparatus 100. More specifically, the imaging controlling function 17a is configured to cause the display 12 to display a Graphical User Interface (GUI) used for receiving operations to input various types of instructions and various types of information from the operator and to control the constituent elements of the MRI apparatus 100 in accordance with the input operations received via the input interface 11. For example, the imaging controlling function 17a is configured to cause the magnetic resonance data to be acquired, by generating the sequence execution data on the basis of imaging conditions input by the operator and outputting the generated sequence execution data to the processing circuitry 15. Further, for example, by controlling the processing circuitry 16, the imaging controlling function 17a is configured to cause the image to be reconstructed on the basis of the magnetic resonance data acquired by the acquiring function 15a. Also, in response to a request from the operator, for example, the imaging controlling function 17a is configured to read any of the images stored in the storage 13 and to cause the display 12 to display the read image.

An exemplary configuration of the MRI apparatus 100 according to the present embodiment has thus been explained. The MRI apparatus 100 according to the present embodiment configured as described above has a function of imaging the subject by implementing an FSE method.

In the present example, the FSE method is an imaging method by which a plurality of echo signals are acquired by applying a plurality of refocus pulses, after applying an excitation pulse once. Further, according to a multi-shot FSE method, a k-space is filled with data by executing multiple sessions of one-shot acquisition. In the FSE method, a series of echo signals acquired by any one shot will be referred to as an echo train.

According to the multi-shot FSE method, for example, when the subject moves during the acquisition of a certain shot, an impact of the body movement on the shot may appear as an artifact in the image.

Figure 2:
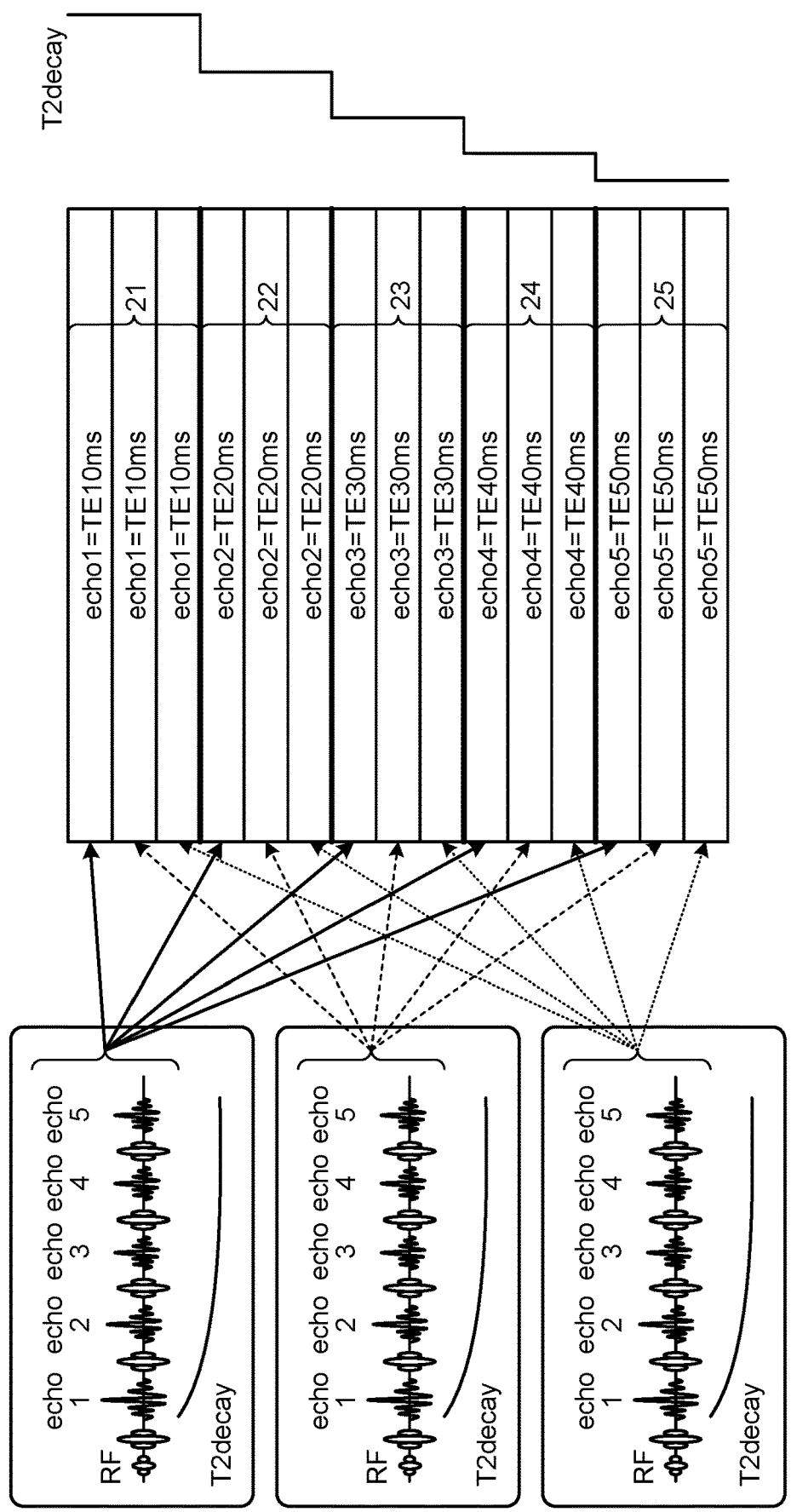
FIG. 2 is a drawing illustrating an example of a data acquisition method according to a comparison example of the present embodiment.

FIG. 2 is a drawing illustrating an example of a data acquisition method according to a comparison example of the present embodiment.

FIG. 2 illustrates an example in which the Echo Train Spacing (ETS) in any one shot is 10 [ms], while the Echo Time (TE) of the echo signals filling the center of the k-space is 30 [ms], and the Echo Train Length (ETL) is 5 [echo signals], so as to acquire data for the k-space with shots in three sessions. In the present example, the ETS denotes the time interval between the echo signals (the time interval of the refocus pulses). Further, the TE value denotes the time period from a peak of the excitation RF pulse to a peak of the echo signal. Further, the ETL denotes the number of echo signals included in each echo train.

Regarding the shots in the three sessions, the left section of FIG. 2 illustrates an excitation RF pulse ("RF") and a plurality of refocus pulses being applied in each shot; five echo signals (echoes 1 to 5) acquired by each shot; and a T2 decay of each shot. Further, the middle section of FIG. 2 depicts the k-space of which the up-and-down direction corresponds to the phase encode direction. Further, the right section of FIG. 2 indicates changes in the signal intensities caused by the T2 decay in the echo signals filling the k-space.

Further, FIG. 2 illustrates the example in which the data corresponding to the k-space is acquired by using a sequential order scheme.

In the example in FIG. 2, five segments 21 to 25 are set by dividing the k-space into segments of three lines in the phase encode direction. In the segments, the echo signals acquired by the shots in the three mutually-different sessions are arranged. More specifically, each segment is filled with three echo signals that are acquired by the shots and have an equal TE, according to the order of the shots in the phase encode direction.

According to this data acquisition method, when data that may cause an artifact is acquired in some of the shots due to a body movement of the subject while the one-shot acquisition is repeatedly performed, the artifact occurs in the phase encode direction. In particular, when data acquired by a shot impacted by the body movement mixes with other data in a central region of the k-space, the quality of the image is significantly degraded.

Figure 3:
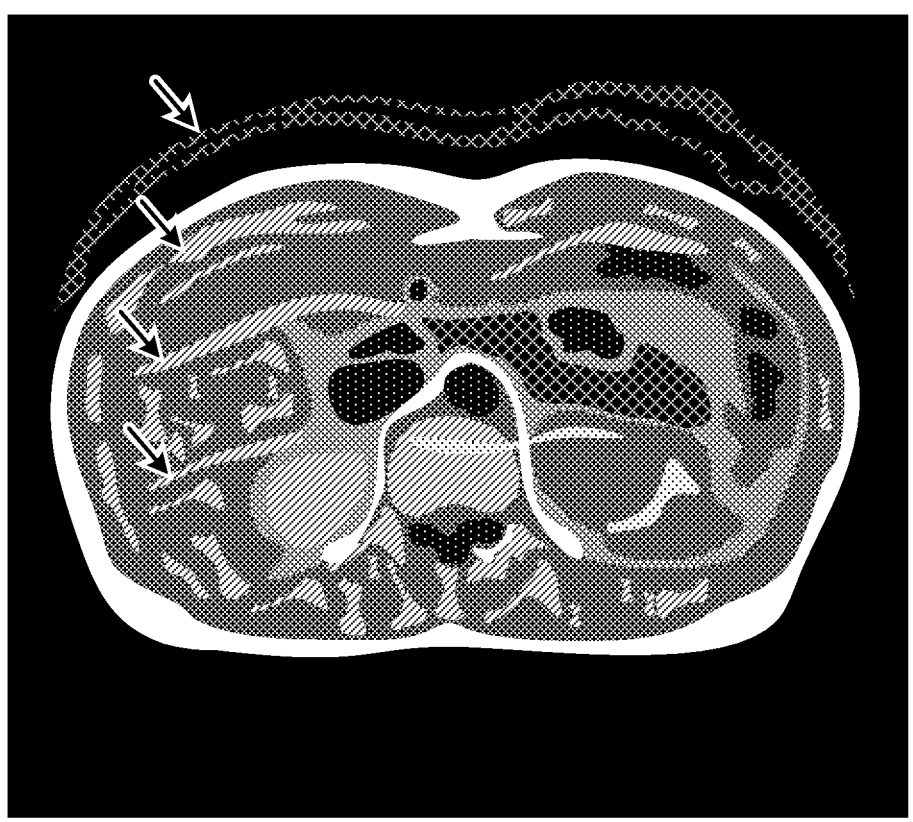
FIG. 3 is a drawing illustrating an example of an image obtained by using the data acquisition method according to the comparison example of the present embodiment.

FIG. 3 is a drawing illustrating an example of an image obtained by using the data acquisition method according to the comparison example of the present embodiment.

For example, as illustrated in FIG. 3, when a T2-weighted image is taken of the abdomen by using the multi-shot FSE method, an artifact may appear from the fat in the abdominal wall when the subject fails to hold his/her breath satisfactorily (see the sections indicated with the arrows in FIG. 3).

To cope with this situation, for example, there is an option to use a single-shot FSE method by which the data of the entire k-space finishes being acquired by a shot in one session. This method, however, has disadvantages where the T2 decay has a larger impact due to an increase in the number of echo trains and where the image may give an out-of-focus feeling because differences in the signal intensities between the echoes are more significant.

The MRI apparatus 100 according to the present embodiment is configured to be able to obtain an image having fewer artifacts, with an imaging process implementing the multi-shot FSE method.

More specifically, in an imaging process implementing the multi-shot FSE method, the acquiring function 15a of the processing circuitry 15 is configured to acquire, for the k-space divided into a plurality of segments with respect to the phase encode direction, one of the segments including a central region of the k-space with one shot. In this situation, during the one-shot acquisition for the central region of the k-space, the acquiring function 15a is configured to ensure that refocus pulses corresponding to a first time period among the refocus pulses applied the plurality of times have a flip angle decreasing tendency, whereas refocus pulses corresponding to a second time period following the first time period among the refocus pulses applied the plurality of times have one of a flip angle maintaining tendency and a flip angle increasing tendency. The acquiring function 15a is an example of an acquiring unit.

In the present example, the first time period and the second time period are each defined, for example, by using a time period (e.g., n seconds to m seconds) since the application of the excitation pulse or the ordinal numbers (e.g., n-th to m-th) of the echo signals.

For example, the acquiring function 15a is configured to acquire the data corresponding to the segment including the central region of the k-space with one shot that is different from a shot used for acquiring the data corresponding to a segment including a peripheral region of the k-space, while varying the flip angle of the refocus pulses so that an earlier stage of a series of echo signals has a flip angle decreasing tendency, whereas the following stage thereof has a flip angle maintaining or increasing tendency.

Further, the acquiring function 15a is configured to regard the echo signals corresponding to the first time period as a dummy and does not arrange the echo signals in the k-space. The generating function 16a of the processing circuitry 16 is configured to generate an MR image by reconstructing the k-space not include the dummy. The generating function 16a is an example of a generating unit.

For example, the generating function 16a is configured to generate an image while excluding the echo signals acquired at the earlier stage, from among the series of echo signals acquired with the shots.

In the following sections, the MRI apparatus 100 configured as described above will be explained in detail.

At first, in the present embodiment, to reduce artifacts that may be caused by body movements, the acquiring function 15a is configured to acquire the data corresponding to the segment including the central region of the k-space with one shot that is different from a shot used for acquiring the data corresponding to a segment including a peripheral region of the k-space.

Figure 4:
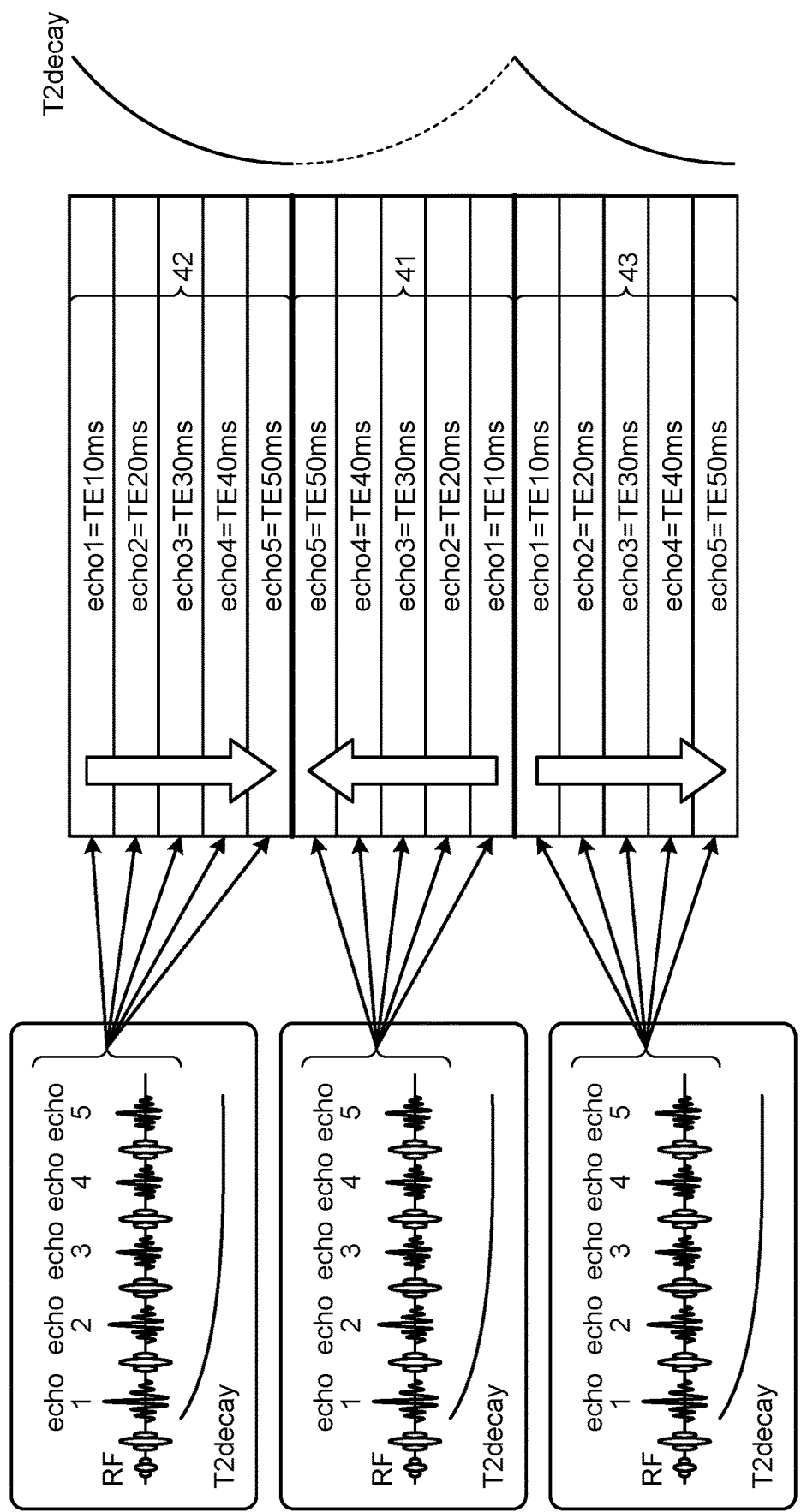
FIG. 4 is a drawing illustrating an example of a data acquisition method according to the present embodiment.

FIG. 4 is a drawing illustrating an example of a data acquisition method according to the present embodiment.

Similarly to the example in FIG. 2, FIG. 4 illustrates an example in which the ETS in any one shot is 10 [ms], while the TE value is 30 [ms], and the ETL is 5 [echo signals], so as to acquire the data for the k-space with shots in three sessions.

Further, regarding the shots in the three sessions, the left section of FIG. 4 illustrates an excitation RF pulse ("RF") and a plurality of refocus pulses being applied in each shot; five echo signals (echoes 1 to 5) acquired by each shot; and a T2 decay of each shot. Further, the middle section of FIG. 4 depicts the k-space of which the up-and-down direction corresponds to the phase encode direction. Further, the right section of FIG. 4 indicates changes in the signal intensities caused by the T2 decay in the echo signals filling the k-space.

In this situation, as illustrated in FIG. 4, for example, the acquiring function 15a divides the k-space into three segments in the phase encode direction, by setting a first segment 41 corresponding to five lines including the central region of the k-space; a second segment 42 corresponding to five lines including a peripheral region positioned on one side (the upper side in FIG. 4) of the central region in terms of the phase encode direction; and a third segment 43 corresponding to five lines including a peripheral region positioned on the other side (the lower side in FIG. 4).

Further, for example, the acquiring function 15a acquires the data corresponding to each of the segments, by filling the second segment 42 with the five echo signals acquired by the shot in the first session; filling the first segment 41 with the five echo signals acquired by the shot in the second session; and filling the third segment 43 with the five echo signals acquired by the shot in the third session. In this situation, with respect to each of the regions, the acquiring function 15a sets a phase encode amount for the echo signals, so that the signals acquired with the shots serve in the filling, in the order of acquisition along the phase encode direction. As a result, the k-space central region is filled with the one shot and is therefore less easily impacted by body movements than in the situation where pieces of data acquired with a plurality of shots are mixed together.

Further, in this situation, the acquiring function 15a acquires, for the k-space divided into the plurality of segments with respect to the phase encode direction, each of the segments including a region other than the central region of the k-space with one shot, while ensuring that the acquisition direction, in terms of the phase encode direction, of the one-shot acquisition for the central region of the k-space is different from the acquisition direction, in terms of the phase encode direction, of the one-shot acquisition for each of the regions positioned adjacent to the central region of the k-space.

In other words, the acquiring function 15a arranges, in the k-space, the plurality of echo signals obtained by the shots in the multiple sessions, in such a manner that a segment filled with echo signals so as to have increasing TE lengths is contiguous to another segment filled with echo signals so as to have decreasing TE lengths.

For example, along the phase encode direction, the acquiring function 15a inverts the filling direction for the filling with the echo signals, between the segment including the central region and each of the segments including the peripheral regions (see the block arrows in FIG. 4). For example, the acquiring function 15a inverts the echo signal filling direction between the shots in the even ordinal numbered sessions and the shots in the odd ordinal numbered sessions. As a result, as illustrated in the right section of FIG. 4, for example, it is possible to keep small the differences in the signal intensities of the echo signals at the boundaries between the regions, even when the signal intensities of the echo signals change due to the T2 decay. In other words, when the acquisition for the k-space is performed in a plurality of segments so that the segment including the central region of the k-space is acquired with one shot, it is possible to enhance continuity of the signal intensities in terms of the phase encode direction, compared to the situation where the acquisition direction remains unchanged among the segments.

Although FIG. 4 illustrates the example in which the data for the k-space is acquired with the shots in an odd number of sessions (the three sessions), the number of sessions of the shots may be an even number.

Figure 5:
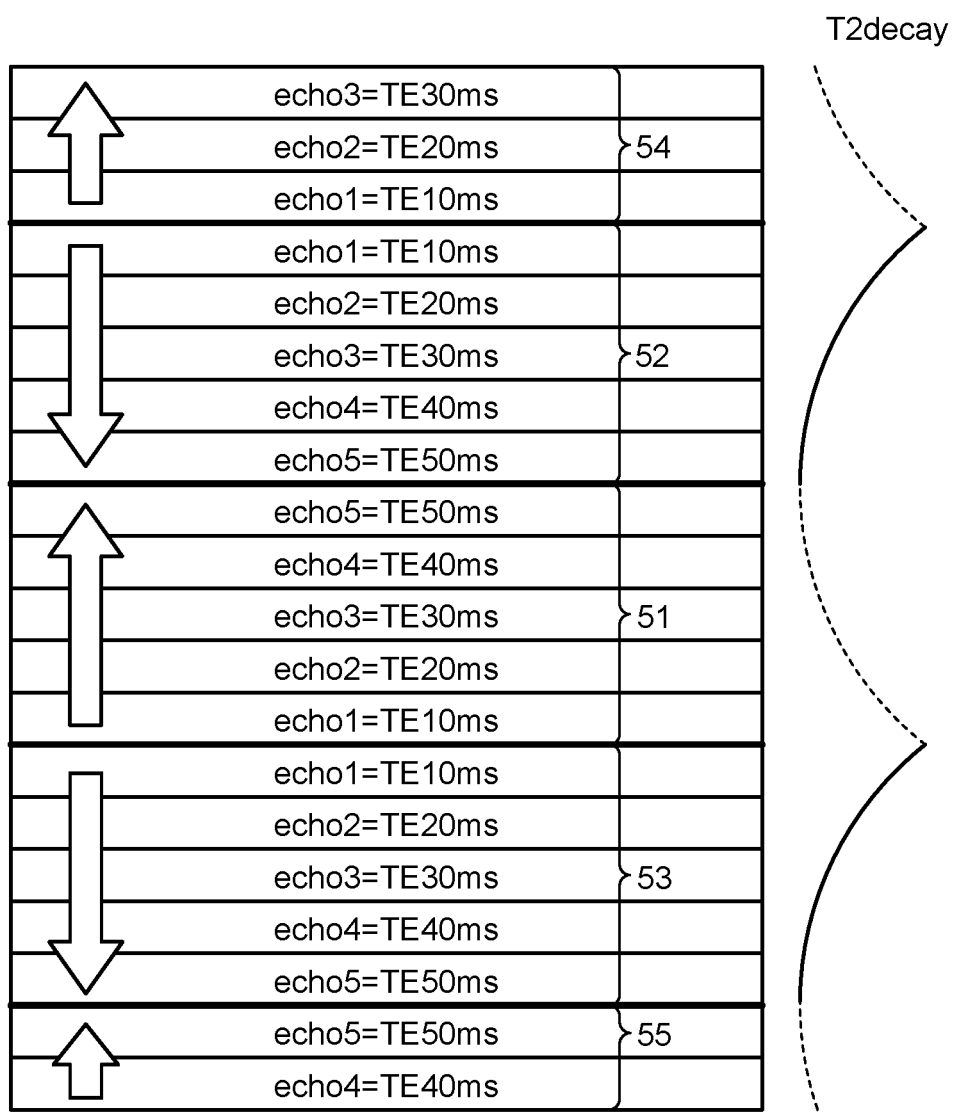
FIG. 5 is a drawing illustrating another example of the data acquisition method according to the present embodiment.

FIG. 5 is a drawing illustrating another example of the data acquisition method according to the present embodiment.

FIG. 5 illustrates an example in which the ETS is 10 [ms], while the TE value is 30 [ms], and the ETL is 5 [echo signals], so as to acquire the data for the k-space with shots in four sessions.

In this situation, as illustrated in FIG. 5 for example, the acquiring function 15a divides the k-space into five segments in the phase encode direction, by setting a first segment 51 corresponding to five lines including the central region of the k-space; a second segment 52 corresponding to five lines including a first peripheral region positioned on one side (the upper side in FIG. 5) of the central region in terms of the phase encode direction; a third segment 53 corresponding to five lines including a second peripheral region positioned on the other side (the lower side in FIG. 5); a fourth segment 54 corresponding to three lines including a third peripheral region positioned on the outside (the upper side in FIG. 5) of the first peripheral region; and a fifth segment 55 corresponding to two lines including a fourth peripheral region positioned on the outside (the lower side in FIG. 5) of the second peripheral region.

Further, for example, the acquiring function 15a acquires the data corresponding to each of the regions in the following manner: Of the echo signals acquired with the shot in the first session, the acquiring function 15a fills the fourth segment 54 with the first to the third echo signals. Of the echo signals acquired with the shot in the first session, the acquiring function 15a fills the fifth segment 55 with the fourth and the fifth echo signals. The acquiring function 15a fills the second segment 52 with the echo signals acquired with the shot in the second session, fills the first segment 51 with the echo signals acquired in the shot with the third session, and fills the third segment 53 with the echo signals acquired with the shot in the fourth session. In this situation, with respect to each of the regions in the k-space, the acquiring function 15a sets a phase encode amount for the echo signals, so that the echo signals acquired with the shots serve in the filling, in the order of acquisition along the phase encode direction.

Further, in this situation, along the phase encode direction, the acquiring function 15a inverts the filling direction for the filling with the echo signals, between the odd ordinary numbered segments and the even ordinary numbered segments (see the block arrows in FIG. 4). For example, the acquiring function 15a inverts the echo signal filling direction between the shots in the even ordinary numbered sessions and the shots in the odd ordinary numbered sessions. As a result, as illustrated in the right section of FIG. 5, for example, it is possible to keep small the differences in the signal intensities of the echo signals at the boundaries between the regions, even when the signal intensities of the echo signals change due to the T2 decay.

According to this data acquisition method, the acquisition for the segment including the central region of the k-space is completed with the one shot and is therefore less easily impacted by body movements compared to the situation where the data is gathered from a plurality of shots.

Further, because the differences in the signal intensities of the echo signals are kept small at the boundaries between the regions in the k-space, the signal intensities of the echo signals continuously change in the phase encode direction. It is therefore possible to reduce artifacts that may be caused by discontinuous changes in the signal intensities.

Figure 6:
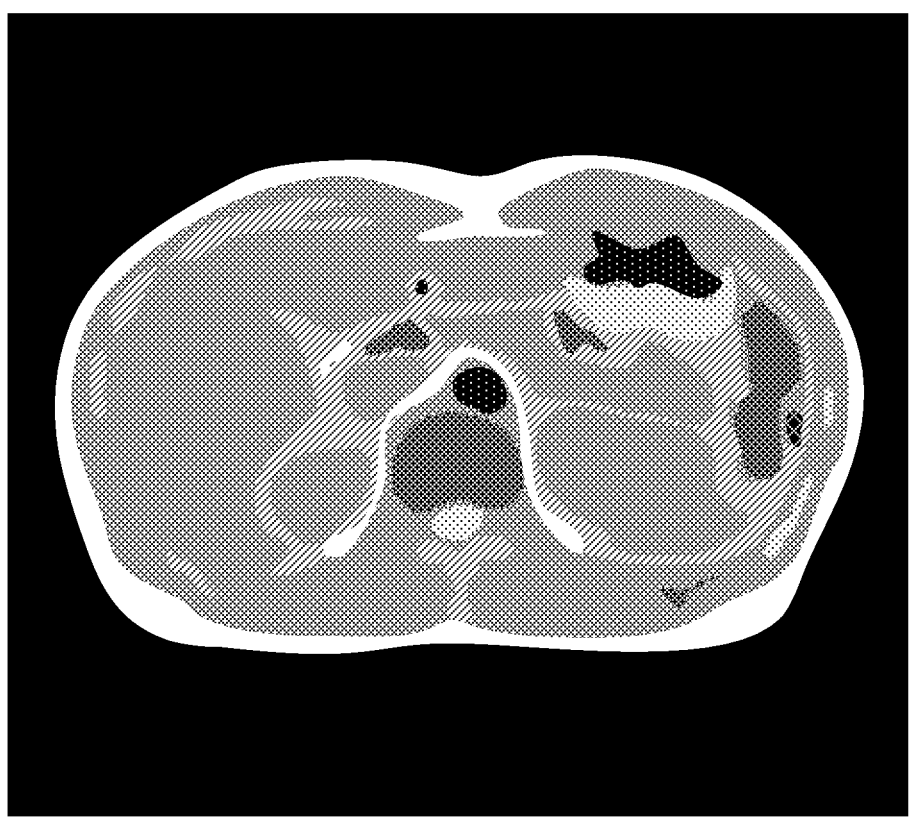
FIG. 6 is a drawing illustrating an example of an image obtained by using the data acquisition method according to the present embodiment.

FIG. 6 is a drawing illustrating an example of an image obtained by using the data acquisition method according to the present embodiment.

For example, as illustrated in FIG. 6, by using the data acquisition method according to the present embodiment, it is possible to obtain an image having fewer artifacts caused by body movements than in the example illustrated in FIG. 3, even when the subject fails to hold his/her breath satisfactorily.

Further, for example, as illustrated in FIGS. 2 and 4, in the data acquisition implementing the FSE method, the T2 decay during the acquisition is unavoidable.

For example, according to the multi-shot FSE method, when the plurality of echo signals obtained with the shots are arranged in mutually-different segments in the k-space, the signal intensities of the echo signals monotonously change due to the T2 decay, along the phase encode direction in a step-like shape, as illustrated in the right section of FIG. 2.

In contrast, when the data acquisition method according to the present embodiment is used, as illustrated in the right section of FIG. 4, the differences in the signal intensities of the echo signals are kept small at the boundaries between the regions in the k-space, so that the signal intensities of the echo signals continuously change with respect to the phase encode direction. Accordingly, the signal intensities of the echo signals change with multimodality where extreme values are exhibited at the boundaries between the regions. As a result, due to the acquisition method according to the present embodiment, a ringing artifact prominently appears, particularly in locations having a large brightness difference between tissues.

To cope with this situation, according to the present embodiment, to reduce the artifacts that may be caused by the T2 decay, the acquiring function 15a is further configured to ensure that, during the one-shot acquisition for the central region of the k-space, refocus pulses corresponding to a first time period among the refocus pulses applied the plurality of times have a flip angle decreasing tendency, whereas refocus pulses corresponding to a second time period following the first time period among the refocus pulses applied the plurality of times have one of a flip angle maintaining tendency and a flip angle increasing tendency.

For example, to reduce the artifacts that may be caused by the T2 decay, the acquiring function 15a is further configured to acquire the data corresponding to the segment including the central region of the k-space, while varying the flip angle of the refocus pulses so that an earlier stage of a series of echo signals has a flip angle decreasing tendency whereas the following stage thereof has one of a flip angle maintaining tendency and a flip angle increasing tendency.

FIG. 7 is a drawing for explaining changes in the flip angle of the refocus pulses in the data acquisition method according to the present embodiment.

The chart in the left section of FIG. 7 indicates the flip angle of the refocus pulses applied at the time of acquiring a series of echo signals corresponding to different positions in the phase encode direction. The chart in the right section indicates the signal intensities of the echo signals acquired by applying the refocus pulses as indicated in the chart in the left section.

More specifically, the broken lines in the charts indicate an example in which the flip angle of the refocus pulses is kept constant at 180° ("180° Constant"), without being varied over the series of echo signals. The dotted chain lines indicate an example in which the flip angle of the refocus pulses is decreased at an earlier stage of the series of echo signals from 180° to a prescribed angle and is subsequently maintained at the prescribed angle at the following stage thereof (example 1). The solid lines indicate an example in which the flip angle of the refocus pulses is decreased at an earlier stage of the series of echo signals from 180° to a prescribed angle and is subsequently increased gradually at the following stage thereof (example 2).

For example, as indicated in the chart in the left section of FIG. 7 with the dotted chain line, the acquiring function 15a acquires the data corresponding to the segment including the central region of the k-space, while varying the flip angle of the refocus pulses, so that the flip angle is decreased at the earlier stage (0 to $t_0$) of the series of echo signals from 180° to the prescribed angle and is subsequently kept constant at the prescribed angle at the following stage thereof (later than $t_0$).

In another example, as indicated in the chart in the left section of FIG. 7 with the solid line, the acquiring function 15a acquires the data corresponding to the segment including the central region of the k-space, while varying the flip angle of the refocus pulses, so that the flip angle is decreased at an earlier stage (0 to $t_1$) of the series of echo signals from 180° to a prescribed angle, is subsequently increased gradually in a prescribed time period ($t_1$ to $t_2$) following the earlier stage, and is then kept constant after that (later than $t_2$). In this situation, for example, the acquiring function 15a increases the flip angle of the refocus pulses so that, at the stage following the earlier stage of the series of echo signals, the changes in the signal intensities of the echo signals occurring from a tissue designated by the operator are constant in the vicinity of the center of the k-space.

Further, also for the data corresponding to the segments including the periphery regions of the k-space, the acquiring function 15a acquires the data while varying the flip angle of the refocus pulses, similarly to when acquiring the data corresponding to the segment including the central region.

For example, in the examples indicated with the dotted chain lines and the solid lines in the charts in FIG. 7, when the echo signals are acquired while varying the flip angle of the refocus pulses so that the earlier stage of the series of echo signals has a flip angle decreasing tendency and the following stage thereof has a flip angle maintaining or increasing tendency, the changes in the signal intensities along the phase encode direction caused by the T2 decay are smaller at the stage following the earlier stage of the series of echo signals. Accordingly, by acquiring the series of echo signals while varying the flip angle of the refocus pulses in the manner described above, it is possible to reduce artifacts that may be caused by the T2 decay.

When the echo signals are acquired while the flip angle of the refocus pulses is varied in the manner described above so that the earlier stage of the series of echo signals has the decreasing tendency, whereas the following stage thereof has the maintaining or increasing tendency, although the changes in the signal intensities along the phase encode direction are smaller as a whole, the echo signals acquired at the earlier stage still have significant changes in the signal intensities.

To cope with this situation, in the present embodiment, for the purpose of further reducing the artifacts that may be caused by the T2 decay, the acquiring function 15a is configured to regard the echo signals corresponding to the first time period as a dummy and does not arrange the echo signals in the k-space. The generating function 16a is configured to generate an MR image by reconstructing the k-space not including the dummy.

For example, the generating function 16a is configured to generate the image while excluding the echo signals acquired at the earlier stage from among the series of echo signals acquired with the shots.

FIG. 8 is a drawing for explaining an image generating process performed by the generating function 16a according to the present embodiment.

In this situation, the top section of FIG. 8 indicates an excitation RF pulse ("RF") and a plurality of refocus pulses being applied in one shot; five echo signals (echoes 1 to 5) acquired by the shot; and a T2 decay of the shot. Further, the bottom section of FIG. 8 indicates changes in the signal intensities caused by the T2 decay in the echo signals filling the k-space. Each of the circles corresponds to an echo signal.

In this situation, for example, as illustrated in FIG. 8, among the five echo signals acquired with the shot for acquiring the data corresponding to the segment including the central region of the k-space, the generating function 16a regards the first and the second echo signals as dummy echoes. Further, also among the five echo signals acquired with the shot for acquiring the data corresponding to the segment including a peripheral region of the k-space, the generating function 16a regards the first and the second echo signals as dummy echoes, similarly to the echo signals acquired with the shot for acquiring the data corresponding to the segment including the central region. Further, the generating function 16a generates an image without using the echo signals regarded as the dummy echoes.

As a result, because the echo signals acquired at the earlier stage where the signal intensities significantly change are not used for generating the image, it is possible to reduce an apparent T2 decay. It is therefore possible to further reduce the artifacts that may be caused by the T2 decay.

FIGS. 9A to 9D are drawings for explaining the reduction of the artifacts in an image obtained by using the data acquisition method according to the present embodiment.

FIGS. 9A to 9D illustrate images obtained by imaging a phantom while using the sequential order scheme or the data acquisition method according to the present embodiment.

Figure 9A:
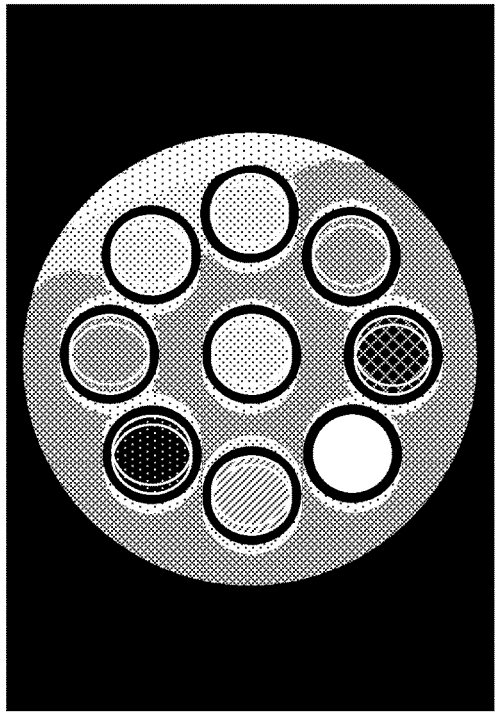
FIGS. 9A to 9D are drawings for explaining a reduction of artifacts in an image obtained by using the data acquisition method according to the present embodiment.

More specifically, FIG. 9A indicates an example in which the flip angle of the refocus pulses is kept constant at 180° ("180° Constant"), by using the sequential order scheme.

Figure 9B:
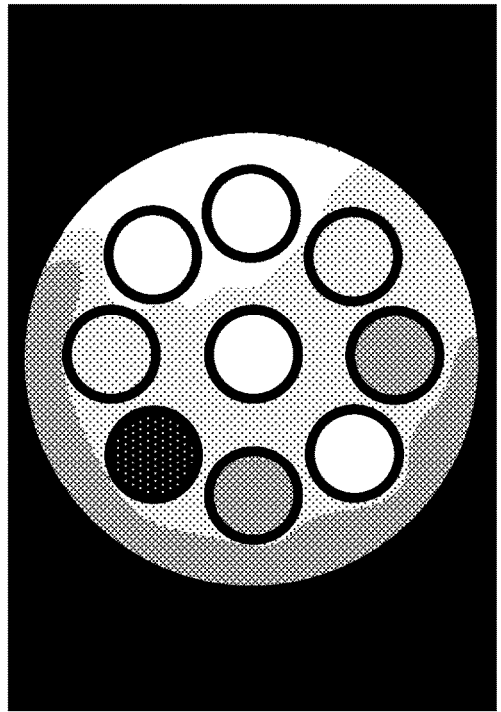

Further, FIG. 9B indicates an example in which the flip angle of the refocus pulses is kept constant at 180° ("180° Constant"), by using the data acquisition method according to the present embodiment.

Figure 9C:
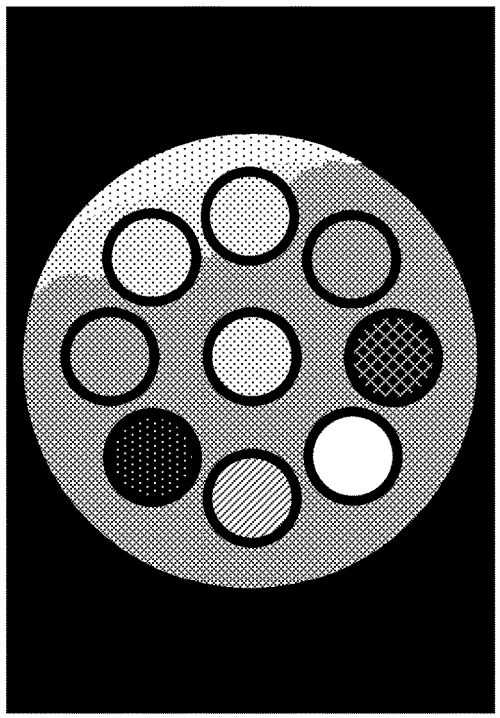

In addition, FIG. 9C indicates an example in which, by using the data acquisition method according to the present embodiment, the flip angle of the refocus pulses is decreased at an earlier stage of the series of echo signals from 180° to a prescribed angle and is subsequently kept constant at the prescribed angle (example 1) at the following stage thereof, so that an image is generated while excluding the echo signals acquired at the earlier stage from among the series of echo signals acquired with the shots.

Figure 9D:
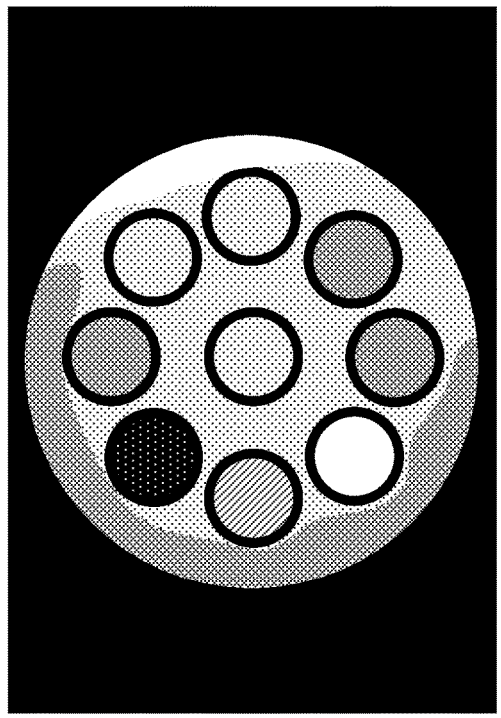

Furthermore, FIG. 9D indicates an example in which, by using the data acquisition method according to the present embodiment, the flip angle of the refocus pulses is decreased at an earlier stage of the series of echo signals from 180° to a prescribed angle and is subsequently increased gradually at the following stage thereof (example 2), so that an image is generated while excluding the echo signals acquired at the earlier stage from among the series of echo signals acquired with the shots.

For example, as illustrated in FIGS. 9A to 9D, when the data acquisition method according to the present embodiment is used, so as to acquire the echo signals while varying the flip angle of the refocus pulses, in such a manner that the earlier stage of the series of echo signals has a flip angle decreasing tendency and the following stage thereof has a maintaining or increasing tendency and so that the image (see FIGS. 9C and 9D) is generated while excluding the echo signals acquired at the earlier stage from among the series of echo signals acquired with the shots, it is possible to further reduce the artifacts that may occur in the vicinity of the boundaries between tissues, compared to the example in which the flip angle of the refocus pulses is kept constant at 180° (see FIG. 9B).

The processing functions of the processing circuitry 14 to 17 have thus been explained. For example, the pieces of processing circuitry may be realized by using one or more processors. In that situation, the processing functions of the pieces of processing circuitry are stored in the storage 13 in the form of computer-executable programs, for example. Further, the pieces of processing circuitry realize the processing functions corresponding to the programs, by reading and executing the programs from the storage 13. In other words, the pieces of processing circuitry that have read the programs have the functions indicated within the pieces of processing circuitry in FIG. 1.

FIG. 10 is a flowchart illustrating a processing procedure in the data acquisition method implemented by the MRI apparatus 100 according to the present embodiment.

For example, as illustrated in FIG. 10, in the present embodiment, upon receipt of an instruction to start an imaging process from the operator via the input interface 11 (step S101: Yes), the imaging controlling function 17a controls the acquiring function 15a to start data acquisition. The process at step S101 is realized, for example, as a result of the processing circuitry 17 reading and executing a prescribed program corresponding to the imaging controlling function 17a from the storage 13.

Further, the acquiring function 15a acquires the data corresponding to the k-space by implementing the FSE method by which the data corresponding to the segment including the central region of the k-space is acquired with one shot that is different from a shot used for acquiring the data corresponding to a segment including a peripheral region of the k-space, while varying the flip angle of the refocus pulses so that the earlier stage of the series of echo signals has a flip angle decreasing tendency, whereas the following stage thereof has a flip angle maintaining or increasing tendency (step S102). The process at step S102 is realized, for example, as a result of the processing circuitry 15 reading and executing a prescribed program corresponding to the acquiring function 15a from the storage 13.

After that, the generating function 16a generates an image while excluding the echo signals acquired at the earlier stage from among the series of echo signals acquired with the shots, on the basis of the data acquired by the acquiring function 15a (step S103). The process at step S103 is realized, for example, as a result of the processing circuitry 16 reading and executing a prescribed program corresponding to the generating function 16a from the storage 13.

The example has been explained in which each of the pieces of processing circuitry 14 to 17 is realized by using a single processor. However, another arrangement is also acceptable in which each piece of processing circuitry is structured by combining together a plurality of independent processors, so that the processing functions are realized as a result of the processors executing the programs. Further, the processing functions of the pieces of processing circuitry may be realized as being distributed among or integrated into one or more pieces of processing circuitry, as appropriate. Further, although in the example illustrated in FIG. 1, the single storage (i.e., the storage 13) has stored therein the programs corresponding to the processing functions, another arrangement is also acceptable in which a plurality of storages are provided in a distributed manner, so that processing circuitry is configured to read corresponding programs from the individual storages.

As explained above, in the present embodiment, in the imaging process implementing the multi-shot FSE method, the acquiring function 15a is configured to acquire, for the k-space divided into the plurality of segments with respect to the phase encode direction, the one of the segments including the central region of the k-space with one shot. It is therefore possible to reduce the artifacts that may be caused by body movements. For example, during an imaging process to take a T2-weighted image of the abdomen, even when the subject fails to hold his/her breath satisfactorily, it is possible to obtain an image having fewer artifacts caused by the body movements. Further, for example, as illustrated in FIG. 4, it is possible to implement the data acquisition method according to the present embodiment, without changing the number of shots, the ETS, the TE value, and the ETL from those of the data acquisition method illustrated in FIG. 2. It is therefore possible to apply the method without prolonging the imaging time period.

Further, in the present embodiment, during the one-shot acquisition for the central region of the k-space, the acquiring function 15a is further configured to ensure that the refocus pulses corresponding to the first time period among the refocus pulses applied the plurality of times have the flip angle decreasing tendency, whereas the refocus pulses corresponding to the second time period following the first time period among the refocus pulses applied the plurality of times have one of the flip angle maintaining tendency and the flip angle increasing tendency. It is therefore possible to reduce the artifacts that may be caused by the T2 decay.

Further, in the present embodiment, the acquiring function 15a is configured to regard the echo signals corresponding to the first time period as the dummy and does not arrange the echo signals in the k-space. The generating function 16a is configured to generate the MR image by reconstructing the k-space not including the dummy. It is therefore possible to further reduce the artifacts that may be caused by the T2 decay.

Consequently, according to at least one aspect of the present embodiments, it is possible to obtain an image having fewer artifacts caused by body movements.

In the embodiment above, the example was explained in which, also for the data corresponding to the segments including the peripheral regions of the k-space, the acquiring function 15a is configured to acquire the data while varying the flip angle of the refocus pulses, similarly to when acquiring the data corresponding to the segment including the central region; however, possible embodiments are not limited to this example.

For instance, for the k-space divided into the plurality of segments with respect to the phase encode direction, the acquiring function 15a may be configured to acquire a segment including a region other than the central region of the k-space with one shot, while causing the flip angle tendency of the refocus pulses used in the acquisition for the central region of the k-space to be different from the flip angle tendency of the refocus pulses used in the acquisition for the region other than the central region of the k-space.

For example, the acquiring function 15a may be configured to vary the pattern of changes in the flip angle of the refocus pulses, between the shot used for acquiring the data corresponding to the segment including the central region of the k-space and the shot used for acquiring the data corresponding to the segment including the peripheral region of the k-space.

For example, during the acquisition for the region other than the central region of the k-space, the acquiring function 15a may be configured to keep unchanged the flip angle of the refocus pulses corresponding to the first time period and to the second time period.

For example, the acquiring function 15a may be configured to acquire the data corresponding to the segment including a peripheral region of the k-space, without changing the flip angle of the refocus pulses. Because the echo signals filling the peripheral region of the k-space has applied thereto a phase encode gradient magnetic field larger than that applied to the echo signals filling the central region, the signal intensities are lower. Accordingly, even when the data corresponding to the segment including the peripheral region is acquired without changing the flip angle of the refocus pulses, the impact of the T2 decay is considered to be small.

Further, in the embodiment above, the example was explained in which, also with respect to the five echo signals acquired with the shot used for acquiring the data corresponding to the segment including the peripheral region of the k-space, the generating function 16a is configured to regard the first and the second echo signals as the dummy echoes, similarly to the echo signals acquired with the shot used for acquiring the data corresponding to the segment including the central region; however, possible embodiments are not limited to this example.

For instance, for the k-space divided into a plurality of segments with respect to the phase encode direction, the acquiring function 15a may be configured to acquire one of the segments including the region other than the central region of the k-space with one shot. During the acquisition for the central region of the k-space, the acquiring function 15a may be configured to regard the echo signals corresponding to the first time period as a dummy and does not arrange the echo signals in the k-space. During the acquisition for the region other than the central region of the k-space, the acquiring function 15a may be configured to arrange all the acquired echo signals in the k-space.

In another example, for the k-space divided into a plurality of segments with respect to the phase encode direction, the acquiring function 15a may be configured to acquire one of the segments including the region other than the central region of the k-space with one shot. During the acquisition for the central region of the k-space, the acquiring function 15a may be configured to regard the echo signals corresponding to the first time period as a dummy and does not arrange the echo signals in the k-space. During the acquisition for the region other than the central region of the k-space, the acquiring function 15a may be configured to set the quantity of the echo signals treated as a dummy to be smaller than that for the central region of the k-space.

For example, the generating function 16a may be configured to vary the number of echo signals to be excluded, between the segment including the central region of the k-space and the segment including a peripheral region.

For example, the generating function 16a may be configured to determine the number of echo signals to be excluded for the peripheral region of the k-space to be smaller than that for the central region. In another example, the generating function 16a may be configured to generate an image without excluding any echo signals for the peripheral region of the k-space. As explained above, the echo signals filling the peripheral region of the k-space have lower signal intensities than the echo signal filling the central region. Accordingly, for the segment including the peripheral region, even when an image is generated while excluding fewer echo signals or while excluding no echo signals, the impact of the T2 decay is considered to be small. Further, by generating the image while excluding fewer echo signals or while excluding no echo signals, it is possible to reduce the number of sessions for acquiring the echo signals and to thus shorten the imaging time period.

Further, in the above embodiment, the example was explained in which both of the two methods are implemented, namely, the method by which the acquiring function 15a varies the flip angle of the refocus pulses during the data acquisition; and the method by which the generating function 16a generates the image while excluding the echo signals acquired at the earlier stage from among the series of echo signals; however, possible embodiments are not limited to this example. For instance, it is also acceptable to implement only the method by which an image is generated while excluding the echo signals acquired at an earlier stage, without implementing the method by which the flip angle of the refocus pulses is varied. In that situation also, it is possible to keep smaller the changes in the signal intensities along the phase encode direction caused by the T2 decay than in the situation where neither of the two methods is implemented. It is therefore possible to further reduce the artifacts that may be caused by the T2 decay.

As another method for keeping small the changes in the signal intensities along the phase encode direction caused by the T2 decay, it is acceptable, for example, to correct and lower the amplitude of the echo signals acquired at an earlier stage among the series of echo signals acquired with the shots. In that situation, for example, in a pre-scan prior to a main acquisition, echo signals corresponding to one shot are acquired without applying the phase encode gradient magnetic field. Further, on the basis of the amplitude of the series of echo signals acquired in the pre-scan, the amplitude of the echo signals acquired at the earlier stage among the series of echo signals acquired in the main acquisition is corrected so as to substantially match the amplitude of the echo signals acquired at the following stage thereof.

Further, in the above embodiment, the example was explained in which the acquiring function 15a is configured to cause the acquisition direction, in terms of the phase encode direction, of the one-shot acquisition for the central region of the k-space to be different from the acquisition direction, in terms of the phase direction, of the one-shot acquisition for the region positioned adjacent to the central region of the k-space; however, possible embodiments are not limited to this example. For instance, the acquiring function 15a may be configured to cause the acquisition direction, in terms of the phase encode direction, of the one-shot acquisition for the central region of the k-space to be the same as the acquisition direction, in terms of the phase direction, of the one-shot acquisition for the region positioned adjacent to the central region of the k-space. In that situation, although continuity of the signal intensities in terms of the phase encode direction is lower than that in the situation where the acquisition directions are mutually different, it is possible to achieve the advantageous effect where the artifacts caused by the T2 decay are reduced, by varying the flip angle of the refocus pulses or by regarding some echo signals as a dummy, as described above.

Further, in the embodiments above, the example was explained in which the acquiring unit and the generating unit of the present disclosure are realized by the acquiring function and the generating function of the processing circuitry, respectively; however, possible embodiments are not limited to this example. For instance, besides using the acquiring function and the generating function described in the embodiments, the functions of the acquiring unit and the generating unit of the present disclosure may be realized by using only hardware, only software, or a combination of hardware and software.

Further, the term "processor" used in the above explanations denotes, for example, a Central Processing Unit (CPU), a Graphics Processing Unit (GPU), or a circuit such as an Application Specific Integrated Circuit (ASIC) or a programmable logic device (e.g., a Simple Programmable Logic Device [SPLD], a Complex Programmable Logic Device [CPLD], or a Field Programmable Gate Array [FPGA]). The one or more processors realize the functions by reading and executing the programs saved in a storage. Instead of saving the programs in the storage, it is also acceptable to directly incorporate the programs in the circuits of the one or more processors. In that situation, the one or more processors realize the functions by reading and executing the programs incorporated in the circuits thereof. Further, the processors in the present embodiments do not each necessarily have to be structured as a single circuit. It is also acceptable to structure one processor by combining together a plurality of independent circuits so as to realize the functions thereof.

In this situation, the programs executed by the processors are provided as being incorporated, in advance, in a Read Only Memory (ROM), a storage, or the like. Alternatively, the programs may be provided as being recorded in a computer-readable storage medium such as a Compact Disk Read-Only Memory (CD-ROM), a Flexible Disk (FD), a Compact Disk Recordable (CD-R), a Digital Versatile Disk (DVD), or the like, in a file in a format that is installable or executable by these devices. Further, the programs may be stored in a computer connected to a network such as the Internet so as to be provided or distributed as being downloaded via the network. For example, the programs are structured with modules including the functional units described above. In the actual hardware, as a result of a CPU reading and executing the programs from a storage medium such as a ROM, the modules are loaded into a main storage device and generated in the main storage device.

According to at least one aspect of the embodiments described above, it is possible to obtain the images having fewer artifacts.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging method for implementing a multi-shot Fast Spin Echo (FSE) method by which a k-space is filled with data by executing multiple sessions of one-shot acquisition during each of which a refocus pulse is applied a plurality of times after an excitation pulse is applied once, so as to acquire a plurality of echo signals, the magnetic resonance imaging method comprising:
   acquiring, for the k-space divided into a plurality of segments with respect to a phase encode direction, one of the segments including a central region of the k-space with one shot, wherein,
   during the one-shot acquisition for the central region of the k-space, refocus pulses corresponding to a first time period among the refocus pulses applied the plurality of times have a flip angle decreasing tendency, and refocus pulses corresponding to a second time period following the first time period among the refocus pulses applied the plurality of times have a flip angle maintaining or increasing tendency.

2. The magnetic resonance imaging method according to claim 1, wherein the plurality of echo signals obtained by the shots in the multiple sessions are arranged in the k-space in such a manner that a segment filled with echo signals so as to have increasing TE (echo time) lengths is positioned contiguous to a segment filled with echo signals so as to have decreasing TE lengths.

3. The magnetic resonance imaging method according to claim 1, further comprising:
   acquiring, for the k-space divided into the plurality of segments with respect to the phase encode direction, one of the segments including a region other than the central region with one shot, wherein
   a flip angle tendency of the refocus pulses used in the acquisition for the central region of the k-space is caused to be different from a flip angle tendency of the refocus pulses used in the acquisition for the region other than the central region of the k-space.

4. The magnetic resonance imaging method according to claim 1, wherein during the acquisition for the region other than the central region of the k-space, a flip angle of the refocus pulses corresponding to the first time period and to the second time period is kept unchanged.

5. The magnetic resonance imaging method according to claim 1, wherein
   echo signals corresponding to the first time period are regarded as a dummy and are not arranged in the k-space, and
   an MR image is further generated by reconstructing the k-space not including the dummy, on a basis of the plurality of echo signals.

6. The magnetic resonance imaging method according to claim 5, further comprising:
   acquiring, for the k-space divided into the plurality of segments with respect to the phase encode direction, one of the segments including a region other than the central region of the k-space with one shot, wherein,
   during the acquisition for the central region of the k-space, the echo signals corresponding to the first time period are regarded as the dummy and are not arranged in the k-space, whereas during the acquisition for the region other than the central region of the k-space, all acquired echo signals are arranged in the k-space.

7. The magnetic resonance imaging method according to claim 5, further comprising:
   acquiring, for the k-space divided into the plurality of segments with respect to the phase encode direction, one of the segments including a region other than the central region of the k-space with one shot, wherein,
   during the acquisition for the central region of the k-space, the echo signals corresponding to the first time period are regarded as the dummy and are not arranged in the k-space, whereas during the acquisition for the region other than the central region of the k-space, a quantity of echo signals treated as a dummy is set to be smaller than that for the central region of the k-space.

8. The magnetic resonance imaging method according to claim 1, further comprising:
   acquiring, for the k-space divided into the plurality of segments with respect to the phase encode direction, one of the segments including a region other than the central region of the k-space with one shot, wherein
   an acquisition direction, in terms of the phase encode direction, of the one-shot acquisition for the central region of the k-space is caused to be different from an acquisition direction, in terms of the phase encode direction, of the one-shot acquisition for a region positioned adjacent to the central region of the k-space.

9. A magnetic resonance imaging apparatus that implements a multi-shot Fast Spin Echo (FSE) method by which a k-space is filled with data by executing multiple sessions of one-shot acquisition during each of which a refocus pulse is applied a plurality of times after an excitation pulse is applied once, so as to acquire a plurality of echo signals, the magnetic resonance imaging apparatus comprising:
   processing circuitry configured to acquire, for the k-space divided into a plurality of segments with respect to a phase encode direction, one of the segments including a central region of the k-space with one shot, wherein,
   during the one-shot acquisition for the central region of the k-space, refocus pulses corresponding to a first time period among the refocus pulses applied the plurality of times have a flip angle decreasing tendency, and refocus pulses corresponding to a second time period following the first time period among the refocus pulses applied the plurality of times have a flip angle maintaining or increasing tendency.

10. The magnetic resonance imaging apparatus according to claim 9, wherein the processing circuitry arranges, in the k-space, the plurality of echo signals obtained by the shots in the multiple sessions, in such a manner that a segment filled with echo signals so as to have increasing TE (echo time) lengths is positioned contiguous to a segment filled with echo signals so as to have decreasing TE lengths.

11. The magnetic resonance imaging apparatus according to claim 9, wherein the processing circuitry further acquires, for the k-space divided into the plurality of segments with respect to the phase encode direction, one of the segments including a region other than the central region with one shot, and the processing circuitry causes a flip angle tendency of the refocus pulses used in the acquisition for the central region of the k-space to be different from a flip angle tendency of the refocus pulses used in the acquisition for the region other than the central region of the k-space.

12. The magnetic resonance imaging apparatus according to claim 9, wherein during the acquisition for the region other than the central region of the k-space, the processing circuitry keeps unchanged a flip angle of the refocus pulses corresponding to the first time period and to the second time period.

13. The magnetic resonance imaging apparatus according to claim 9, wherein the processing circuitry regards echo signals corresponding to the first time period as a dummy and does not arrange the echo signals in the k-space, and the processing circuitry further generates an MR image by reconstructing the k-space not including the dummy, on a basis of the plurality of echo signals.

14. The magnetic resonance imaging apparatus according to claim 13, wherein the processing circuitry further acquires, for the k-space divided into the plurality of segments with respect to the phase encode direction, one of the segments including a region other than the central region of the k-space with one shot, during the acquisition for the central region of the k-space, the processing circuitry regards the echo signals corresponding to the first time period as the dummy and does not arrange the echo signals in the k-space, and during the acquisition for the region other than the central region of the k-space, the processing circuitry arranges all acquired echo signals in the k-space.

15. The magnetic resonance imaging apparatus according to claim 13, wherein the processing circuitry further acquires, for the k-space divided into the plurality of segments with respect to the phase encode direction, one of the segments including a region other than the central region of the k-space with one shot, during the acquisition for the central region of the k-space, the processing circuitry regards the echo signals corresponding to the first time period as the dummy and does not arrange the echo signals in the k-space, and, during the acquisition for the region other than the central region of the k-space, the processing circuitry sets a quantity of echo signals treated as a dummy to be smaller than that for the central region of the k-space.

16. The magnetic resonance imaging apparatus according to claim 9, wherein the processing circuitry further acquires, for the k-space divided into the plurality of segments with respect to the phase encode direction, one of the segments including a region other than the central region of the k-space with one shot, and the processing circuitry causes an acquisition direction, in terms of the phase encode direction, of the one-shot acquisition for the central region of the k-space to be different from an acquisition direction, in terms of the phase encode direction, of the one-shot acquisition for a region positioned adjacent to the central region of the k-space.

* * * * *